United States Patent [19]

Pack

[11] 3,903,427

[45] Sept. 2, 1975

[54] SOLAR CELL CONNECTIONS

[75] Inventor: George J. Pack, Los Angeles, Calif.

[73] Assignee: Hughes Aircraft Company, Culver City, Calif.

[22] Filed: Dec. 28, 1973

[21] Appl. No.: 429,430

[52] U.S. Cl. .................. 250/578; 250/211 J; 357/30

[51] Int. Cl. .................. H01j 39/12

[58] Field of Search ............. 250/211 R, 211 J, 208, 250/578; 317/235 N

[56] References Cited

UNITED STATES PATENTS

| | | | |
|---|---|---|---|
| 2,629,802 | 2/1953 | Pantchechnikoff | 250/211 J |
| 2,735,919 | 2/1956 | Shower | 250/211 J |
| 2,862,160 | 11/1958 | Ross | 317/235 N |
| 3,482,198 | 12/1969 | Hopper | 317/235 N |
| 3,502,507 | 3/1970 | Mann | 317/235 N |
| 3,651,564 | 3/1972 | Glass | 250/211 J |

*Primary Examiner*—James W. Lawrence
*Assistant Examiner*—D. C. Nelms
*Attorney, Agent, or Firm*—W. H. MacAllister; Lewis B. Sternfels

[57] ABSTRACT

The 10 percent increase in useful power from a photocell area without increasing the size or weight of the cell and with the capability to decrease the temperature of the cells themselves due to elimination of some of the power losses is obtained by taking the front leads through the cell to its back surface instead of across its surface.

8 Claims, 2 Drawing Figures

SOLAR CELL CONNECTIONS

BACKGROUND OF THE INVENTION

1. Field of the Invention

The present invention relates to solar or photovoltaic cells and, in particular, to interconnects therefor.

2. Description of the Prior Art

Conventional photocells generally comprise a wafer of semiconductor material which is sensitive to light. Upon exposure thereto, the semiconducting material generates current which is picked up by conductive strips lying across the upper surface of the cell. These strips are connected to a common lead or leads placed on this top surface of the cell. At the back surface of the cell is a back conductor and the back conductor of one cell is secured to the front conductor of an adjacent cell in series to augment the small power output thereof. An examination of several photocells indicates that approximately ten percent of the surface area is used by the front conductor strips. Furthermore, the resistance of the front lead is several times that of the back lead. This construction results in the disadvantage of photocell power loss, which is proportional to the percent of active area lost by front leads and to the resistance of the leads used to conduct current from the cell itself.

SUMMARY OF THE INVENTION

The present invention overcomes these and other problems and disadvantages by so constructing each solar cell that the front leads are passed through one or more holes in the cell instead of across the surface, thereby eliminating the prior art conductive strips. The resulting area used for a lead is then approximately reduced to one percent to two percent of the total area with no increase in the basic cell resistance.

It is, therefore, an object of the present invention to provide an improved solar cell construction.

Another object is to increase the useful photocell current generating area.

Another object is to decrease power ($I^2R$) losses at the cell.

Another object is to provide the solar cell with reduced resistance of the front lead so that it is approximately that of the back lead.

Other aims and objects, as well as a more complete understanding of the present invention, will appear from the following explanation of an exemplary embodiment and the accompanying drawings thereof.

DESCRIPTION OF THE PREFERRED EMBODIMENT

Figure 1:
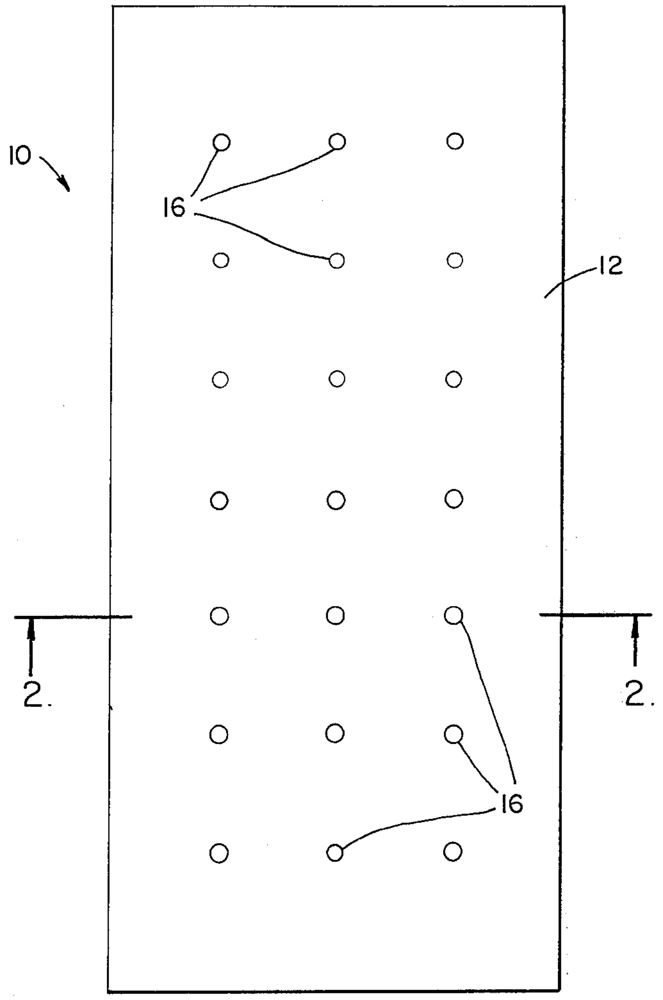
FIG. 1 is a top view of a solar or photovoltaic cell.
Figure 2:
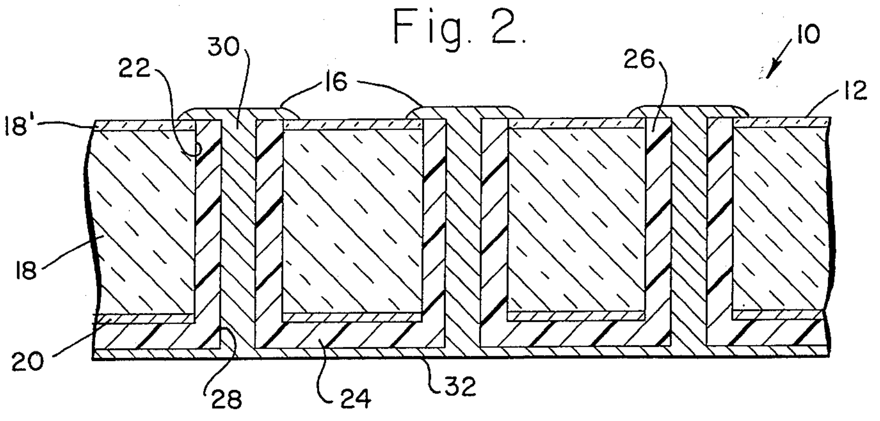
FIG. 2 is a cross section of the cell of FIG. 1 taken along lines 2—2 thereof.

A photovoltaic or solar cell 10 is formed from a wafer of semiconductor material 18 of P/N or N/P construction, having a top layer 18' of N-type silicon on P-type silicon or vice versa, for example, with a front surface 12 and a rear surface 14. Placed across the front surface of the cell is a pattern or plurality of one or more spaced current pick-up points 16 configured as small, individual metallic contacts. These contacts are laid on the front surface. Attached to the back side of the semiconductor material is a first conductor 20. Machined or otherwise formed through semiconductor material 18 and back leads 20, such as by laser or electron beam drilling, are a plurality of holes 22 which extend from front surface 12 through back surface 14 and back conductor 20. Within holes 22 and along back conductor 20 is placed a layer of electrical insulation material. This layer includes insulation coatings 26 within each of the holes to form an insulated hole 28. A pass-through conductor 30 is electrically coupled to each contact 16 and extends through holes 28 to a metal layer 32 which is adhered to insulation layer 24.

Although contacts 16 are shown as buttons spaced in parallel, they may take any suitable form in any suitable configuration, whether parallel or not. Specifically, contacts 16 are so numbered and designed to minimize resistance, yet to maximize surface area for generation of current. That is, because contacts 16 comprise the points at which current collects, there should not be so much distance between contacts as to produce an unacceptable power loss due to increased resistance. However, there should not be so many contacts that the effective current producing area is reduced to a level comparable to that of conventional cells. Thus, a balance between number and spacing of contacts vis-a-vis usable surface is attained to provide efficient use of the invention. By passing the leads through the cell rather than across the cell, the total resistance of the front lead can be reduced to that of the back lead. To pass the front leads through the cell, holes of approximately 0.010 inches diameter are machined or otherwise formed through the cell, such as by laser cutting and electron beam cutting. As a consequence of the construction of the present invention, for a given area and weight of photocell arrays, an increase of approximately 8 to 10 percent in power can be obtained along with a reduction of temperature of the cells due to decrease in power losses at the cell itself.

In connecting one cell to another, whether in parallel or in series, all connections are made at the backside of the cells, thereby facilitating assembly operations.

Although the invention has been described with reference to a particular embodiment thereof, it should be realized that various changes or modifications may be made therein without departing from the spirit and scope of the invention.

What is claimed is:

1. A solar cell array comprising:

a plurality of solar cells electrically connected together;

each of said cells including a flat wafer of light sensitive semiconductor material having an upper surface and a lower surface, a pattern of individual, spaced electrical current pick-up contacts on said upper surface of each of said cells, first conductor means secured to said lower surface, a layer of insulation secured to said first conductor means, second conductor means secured to said layer of insulation material in electrical isolation from said first conductor means, a plurality of means for defining holes extending from each of said electrical current pick-up contacts and through said flat wafer and said light sensitive semiconductor material, and said first conductor means, said layer of insulation including means for defining insulation sleeving integral therewith and extending through each of said plurality of hole means, and said second conductor means including individual pass-through conductors integral therewith and extending through each of said insulation sleeving and each of said plurality of hole means and into electrical connection with each of said electrical current pick-up contacts; and said first conductive means of each one of said solar cells being electrically secured to said second conductive means of adjacent ones of said solar cells in electrical connection.

2. A photovoltaic device comprising a member of electromagnetic radiation sensitive, current generating material, means for defining at least one current pick-up point on one surface of said member, means for defining at least one hole and insulation therein extending through said member from said current pick-up point means to a second surface of said member, at least a first current-carrying conductor coupled to said second surface and with said insulated hole means extending through said first current-carrying conductor, and at least a second current-carrying conductor on said second surface electrically insulated from said first current-carrying conductor and electrically coupled to said current pick-up point means through said means for defining said hole and said insulation therein.

3. A device as in claim 2 wherein said first current-carrying conductor comprises a metal layer bonded to said member at said second surface, and further including a layer of insulation material bonded to said metal layer for electrically insulating said second current carrying conductor from said metal layer.

4. A device as in claim 3 wherein said second current-carrying conductor comprises a second metal layer bonded to said layer of insulation.

5. A device as in claim 2 wherein said pick-up point means comprises at least one metal contact button.

6. A device as in claim 2 wherein said current-carrying point means comprises a plurality of individual, parallelly spaced contacts on said one surface of said member, said member being otherwise free from conductive material on said one surface and including means below said one surface for coupling said parallelly spaced contacts for maximizing the area of said one surface for maximized exposure of said light sensitive, current generating material to light.

7. A device as in claim 6 wherein said insulated hole means comprises a plurality of parallelly positioned hole means insulated from said current pick-up point means and extending through said member and to said plurality of parallelly spaced contacts, and further including a plurality of conductive leads extending through said plurality of insulated hole means and electrically coupling said contacts to said second current-carrying conductor.

8. A device as in claim 6 wherein the spacing between said contacts and the number of said contacts is balanced with respect to the area of said member for maximizing the area of said one surface for maximum generation of current and minimum power loss.

* * * * *